(12) United States Patent
Vance

(10) Patent No.: US 9,258,901 B2
(45) Date of Patent: Feb. 9, 2016

(54) METHOD FOR INSTALLING MICROWIRE

(71) Applicant: The Boeing Company, Chicago, IL (US)

(72) Inventor: Jonathan B. Vance, Saint Louis, MO (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/134,028

(22) Filed: Dec. 19, 2013

(65) Prior Publication Data

US 2014/0102769 A1   Apr. 17, 2014

Related U.S. Application Data

(62) Division of application No. 12/985,247, filed on Jan. 5, 2011, now Pat. No. 8,635,767.

(51) Int. Cl.
| | |
|---|---|
| *H05K 3/02* | (2006.01) |
| *H05K 3/10* | (2006.01) |
| *H05K 13/06* | (2006.01) |
| *H05K 1/02* | (2006.01) |
| *H05K 3/38* | (2006.01) |
| *H05K 3/46* | (2006.01) |

(52) U.S. Cl.
CPC ............... *H05K 3/103* (2013.01); *H05K 1/02* (2013.01); *H05K 13/06* (2013.01); *H05K 3/386* (2013.01); *H05K 3/4664* (2013.01); *H05K 2201/10287* (2013.01); *H05K 2203/1545* (2013.01); *Y10T 29/532* (2015.01); *Y10T 29/53213* (2015.01)

(58) Field of Classification Search
CPC ..................... H01L 24/11; H01L 2224/48247; Y10T 29/49155; Y10T 29/49126; Y10T 29/49128; Y10T 428/24917; Y10T 29/49064; H05K 2201/0195; H05K 1/0298; Y10S 428/901; C04B 41/81; H01P 11/003
USPC ........... 29/846, 825, 829, 848, 877, 745, 748; 257/698, 778, 784, E23.025, E23.067, 257/E23.079; 427/99.3, 123, 205, 436
See application file for complete search history.

(56) References Cited

U.S. PATENT DOCUMENTS

| | | | | |
|---|---|---|---|---|
| 4,416,914 | A * | 11/1983 | Eichelberger et al. | ........ 427/510 |
| 6,831,371 | B1 * | 12/2004 | Huemoeller et al. | ......... 257/778 |
| 6,896,170 | B2 * | 5/2005 | Lyn et al. | ....................... 228/4.5 |

* cited by examiner

*Primary Examiner* — Thiem Phan
(74) *Attorney, Agent, or Firm* — Felix L. Fischer

(57) ABSTRACT

A microcircuit deposition system incorporates a first printing engine for depositing a dielectric on a substrate. A microwire spooling machine houses a microwire spool and incorporates a tension guide to position a microwire trace onto the dielectric layer. A second printing engine trails the microwire spooling machine to deposit a covering dielectric layer over the microwire trace.

10 Claims, 6 Drawing Sheets

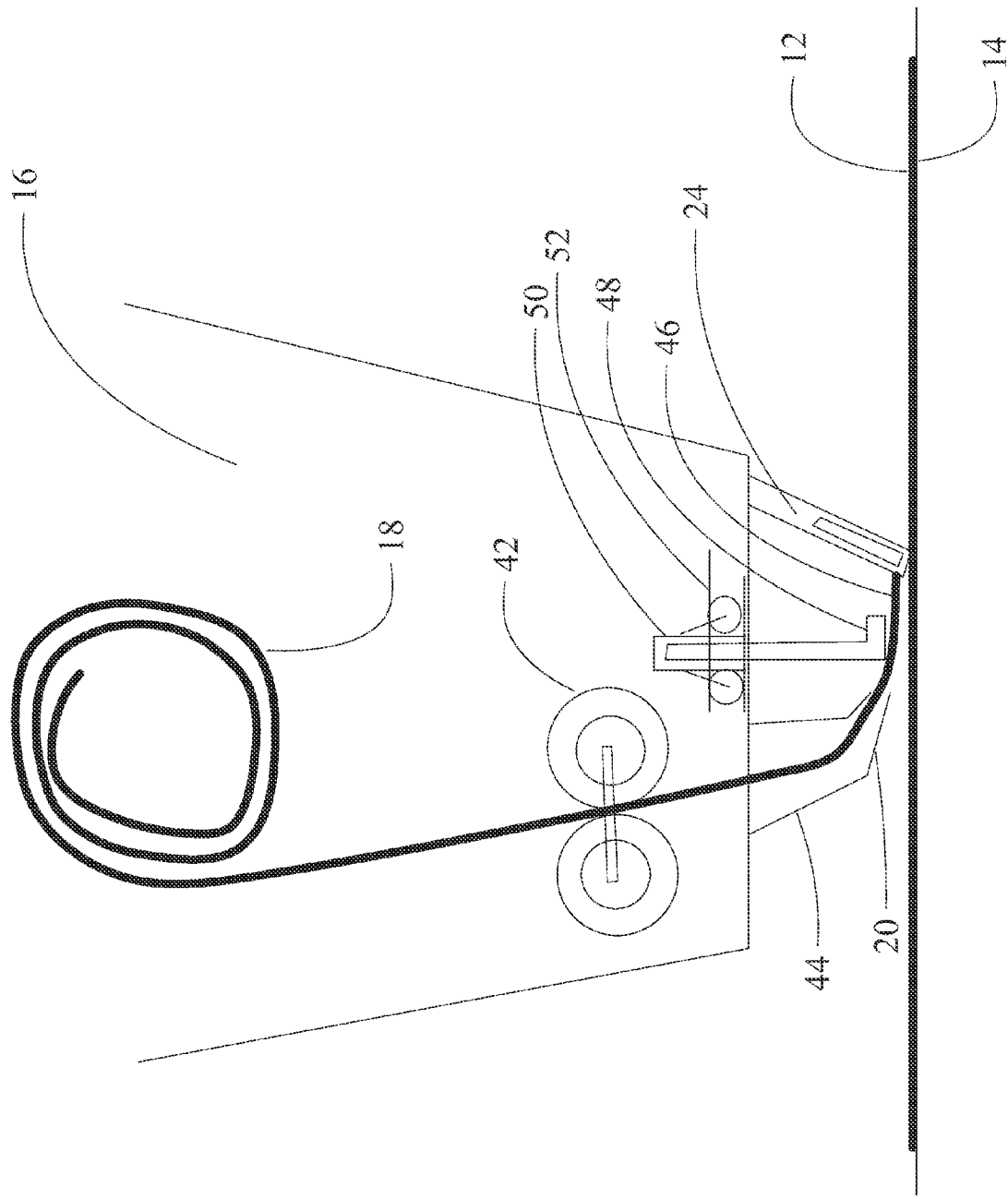

METHOD FOR INSTALLING MICROWIRE

REFERENCE TO RELATED APPLICATIONS

This application is a divisional of U.S. application Ser. No. 12/985,247 filed on Jan. 5, 2011 entitled System for Depositing Microwire having a common assignee with the present application, the disclosure of which is included herein by reference.

BACKGROUND INFORMATION

1. Field

Embodiments of the disclosure relate generally to the field of electronic circuits and more particularly to embodiments for depositing dielectric and conductive materials in combination with microwire conductors for electrical circuits.

2. Background

Efficient systems for creating electrical circuits in modern system in package (SIP) devices or on conformal surfaces of vehicles or other platforms such as Unmanned Aerial Vehicles (UAVs), including direct deposit on composite skins and supporting structures on platforms where there is a desire to reduce discrete wiring, is becoming a necessity. Current systems incorporate "direct-write processes" which print dielectric and conductive materials onto desired surfaces. Those processes use inks and pastes that incorporate nano-sized particles or conductors, semiconductors, and dielectrics. The aforementioned nano materials are suspended in a solvent which is then removed with curing or thermal processing. The conductive traces that are currently provided by these processes may exhibit significant resistance which could adversely affect many circuits that will carry power or impedance-sensitive signals.

It is therefore desirable to provide a circuit deposition system which will place high-quality traces that will exhibit stronger mechanical properties and lower impedance.

SUMMARY

Exemplary embodiments provide a microcircuit deposition system which incorporates a first printing engine for depositing a dielectric on a substrate. A microwire spooling machine houses a microwire spool and incorporates a tension guide to position a microwire trace onto the dielectric layer. A second printing engine trails the microwire spooling machine to deposit a covering dielectric layer over the microwire trace.

The features, functions, and advantages that have been discussed can be achieved independently in various embodiments of the present invention or may be combined in yet other embodiments further details of which can be seen with reference to the following description and drawings.

BRIEF DESCRIPTION OF THE DRAWINGS

FIG. 3 is a schematic detail of elements of the microwire deposition element for the exemplary embodiment of FIG. 1; and, FIG. 4 is a flow chart for a microwire deposition process employing the exemplary embodiment.

DETAILED DESCRIPTION

The embodiments described herein demonstrate a system for controlled installation of thin, uninsulated copper wire of less than 100 micrometers (about 38 gauge or less) in diameter (microwire) onto various substrates including composite skins, subsystem enclosures, and supporting structures on platforms where there is a desire to reduce discrete wiring. A spooling machine places the microwire onto the substrate with a control tip, and a direct-write deposition system will both precede and follow the tooltip to print dielectric material for insulating the microwire and conducting material where needed to bridge the microwire with other traces or circuit elements.

Figure 1:
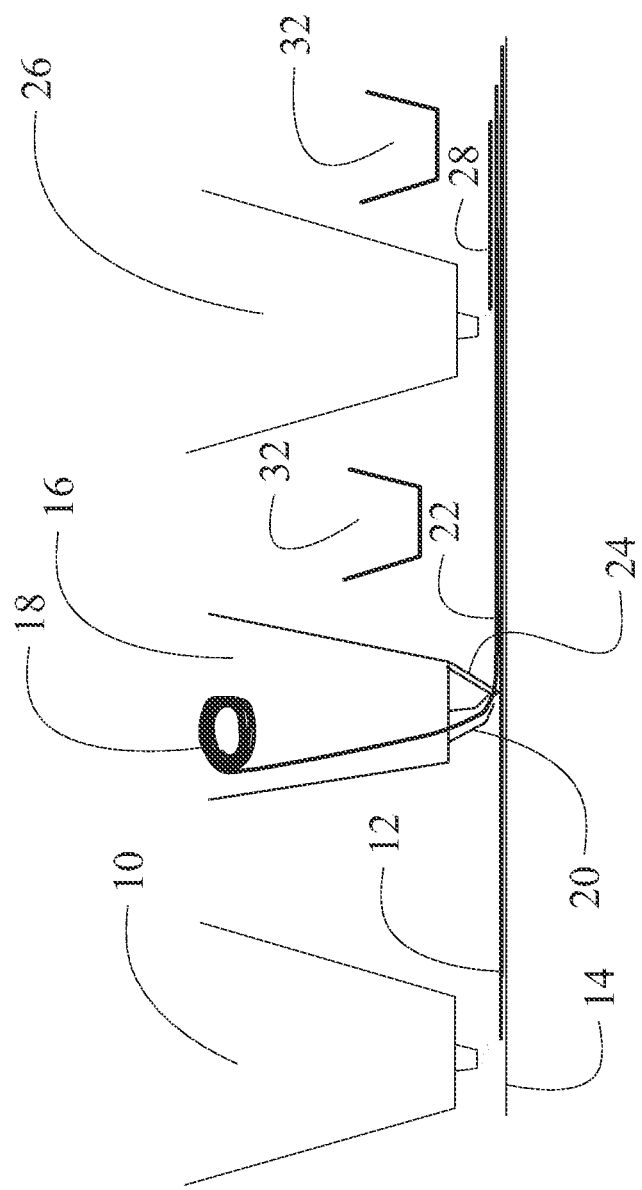
FIG. 1 is schematic view of elements of a deposition system employing an exemplary embodiment.

Referring to the drawings, FIG. 1 shows an exemplary embodiment of a deposition system employing a first printing engine 10 for depositing a dielectric or insulating layer 12 on a substrate 14. A microwire spooling machine 16 houses microwire spools 18 and employs a tensioning guide 20 to position a microwire trace 22 onto the dielectric layer. The spooling machine may be mechanically or controllably connected to track the first printing engine at a desired distance. In the exemplary embodiment, the microwire trace may be deposited onto the dielectric layer while still tacky from printing to provide an adhesive effect in constraining the microwire trace. A cutter 24 severs the microwire trace at a desired length. A second printing engine 26 trails the microwire spooling machine to deposit a covering dielectric or insulating layer 28. The second printing engine may be mechanically or controllably connected to track the first printing engine at a desired distance.

Figure 2A:
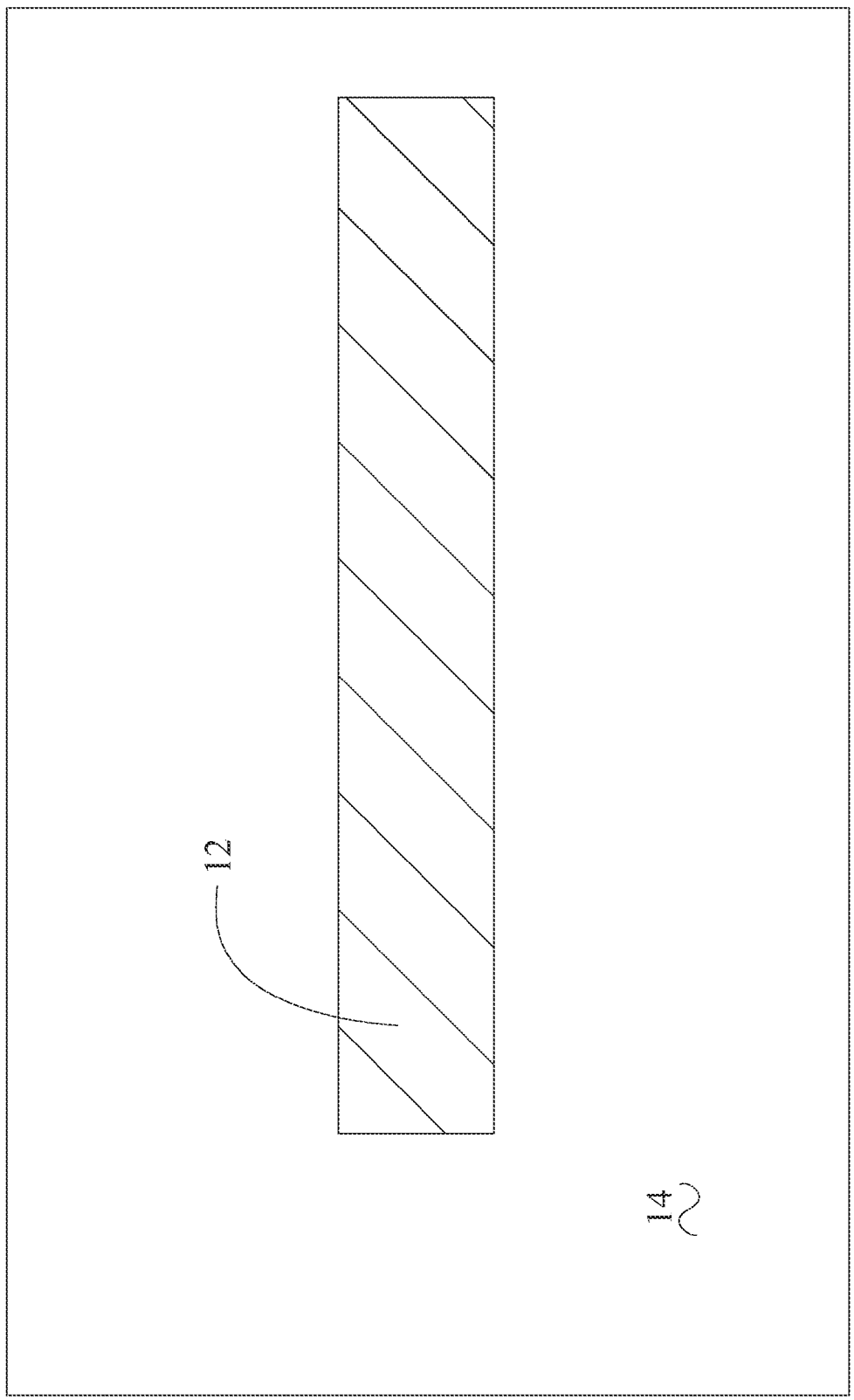
FIGS. 2A-2C are schematic representations of component layers deposited by the system of FIG. 1.
Figure 2B:
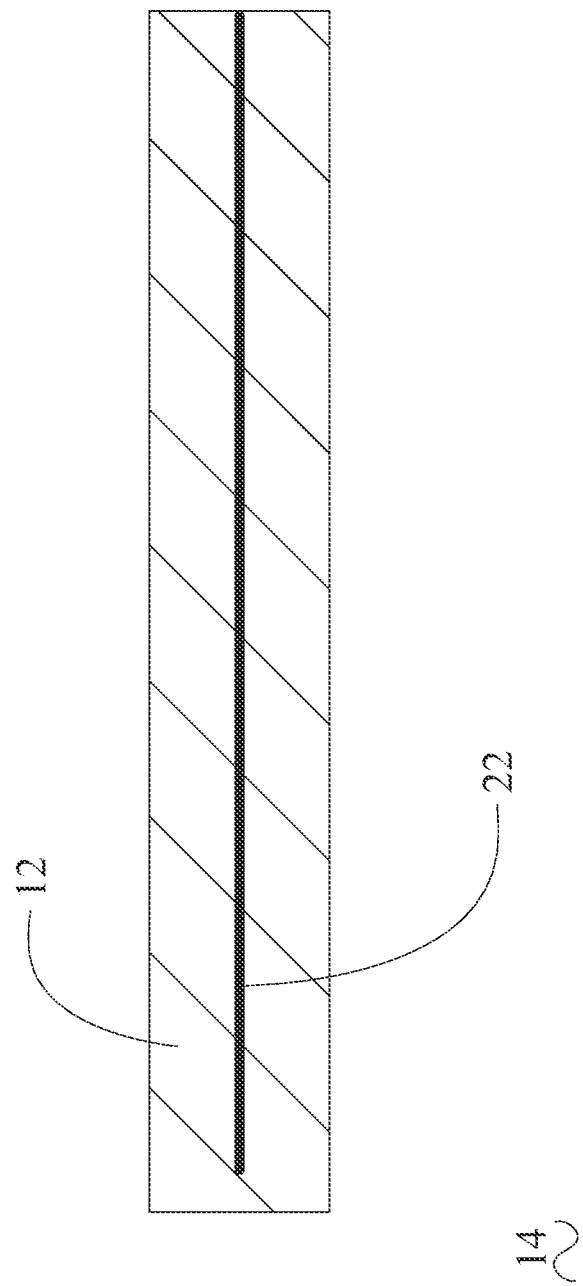
Figure 2C:
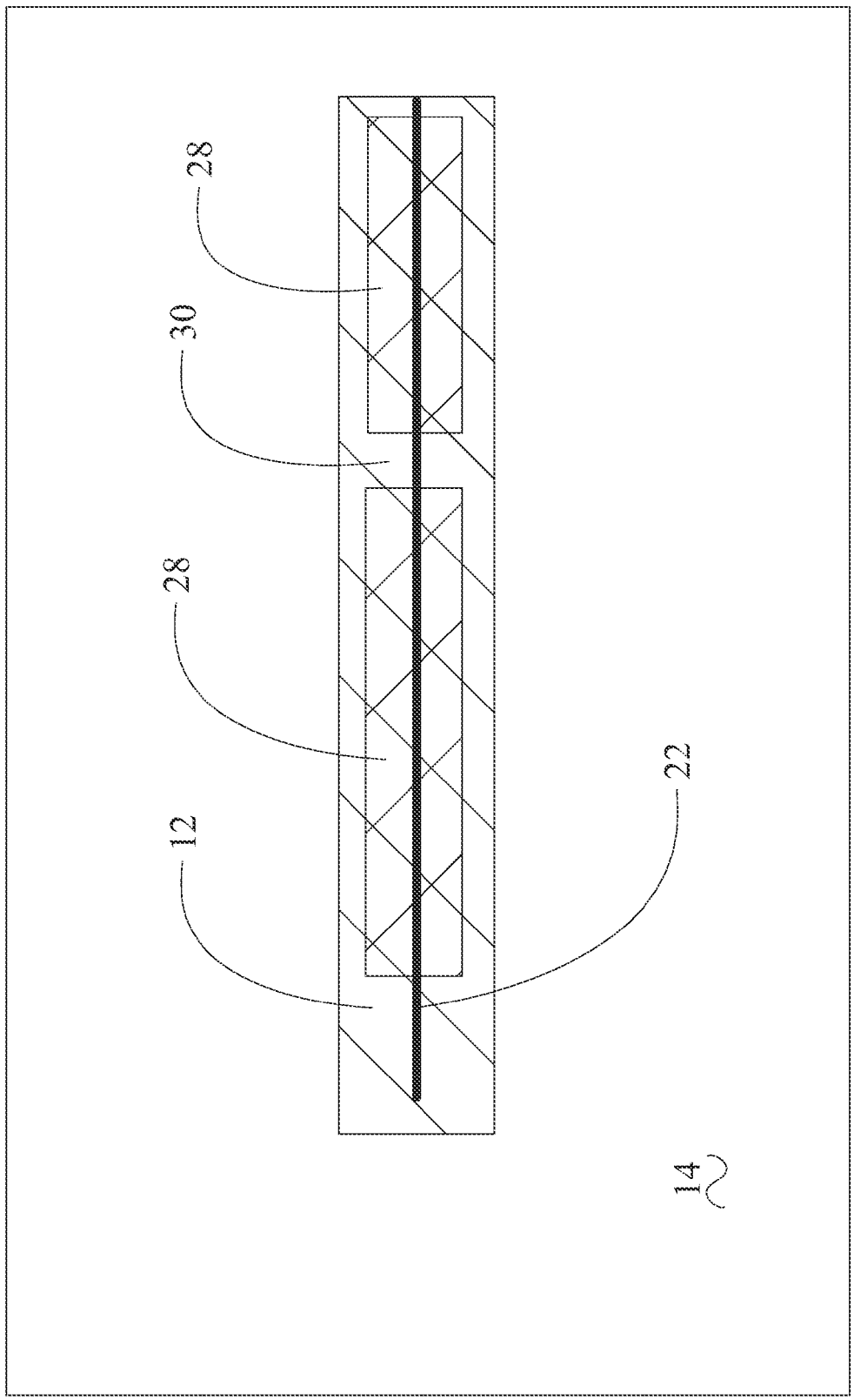

As shown in FIGS. 2A-2C, dielectric layer 12 as deposited on substrate 14 provides an insulating path as shown in FIG. 2A for segregation of the microwire trace from the surface of the substrate which may be a composite, titanium, aluminum or alternative material surface associated either with a system-in-a-package (SIP) integrated circuit, other printed circuit element or an operational surface such as an unmanned aerial vehicle (UAV) skin. For an exemplary embodiment, the dielectric layer incorporates Polyvinylbutyral (PVB) materials. Microwire trace 22 deposited on the dielectric layer 12 as shown in FIG. 2B provides a high conductivity trace with superior mechanical properties to a printed conductive trace. In exemplary embodiments copper (Cu) wire is employed but conductive alloys may be employed in alternative embodiments. As an example, a silver ink printed trace of 1 m in length has a resistance of approximately 1 kΩ. For the exemplary embodiments of microwire traces with $R=\rho l/A$ where R is total resistance, $\rho$ is the resistivity ($1.68 \times 10^{-8}$ Ωm for Cu), l is the length of the trace (1 m) and A is the cross sectional area of the trace ($8 \times 10^{-9}$ m2 for exemplary 38 gauge microwire) a total resistance of 2.1Ω is provided for a 1 m trace. Deposition of the covering dielectric layer 28 as shown in FIG. 2C provides top insulation for the microwire trace as well as additional adhesive capability to restrain the microwire. A printing gap 30 is shown in the covering dielectric layer representative of the capability in the system to provide cross connection with subsequently printed traces of silver ink or similar materials or other micro wire traces for cross connection traces or circuits. While shown for the covering layer, similar printing gaps may be employed in the initial dielectric layer for circuit interconnection with lower layers of conductive materials on the substrate thereby enabling stacked electronic circuits.

The system may also employ one or more ultraviolet (UV) curing elements 32 as shown in FIG. 1 tracking the spooling machine and second printing engine for curing after printing of dielectric layers employing a UV sensitive polymer as a portion of the dielectric layer composition.

An exemplary arrangement for the Microwire spooling machine 16 shown in FIG. 3. Microwire of small gage approximately 38 or 40 (100.838 μm or 79.756 μm respectively) is held in a dispensing spool 18 from which the microwire is drawn and fed through a set of feed rollers 42. A guide bale 44 or similar structure orients and guides the microwire for placement onto the substrate or dielectric covering layer with tensioning guide 20. A cutter 24 is provided to sever the wire at the termination of a trace. For the embodiment shown, the cutter operates transversely to allow a micro wire tail 46 to extend from the guide bale. A positioning foot 48 is moveable vertically in a telescoping fitting 50 to engage and urge the tail into surface contact. Roller mounting of fitting 50 horizontally in track 52 allows controlled lateral motion of the foot to maintain contact of the tail during initial lateral motion of the spooling machine for sufficient adherence to the surface of the dielectric layer 12 to maintain position. The foot is then withdrawn and the guide bale and tensioning guide then maintain sufficient tension in the microwire trace as deposited to provide the desired linearity of the trace.

Figure 4:
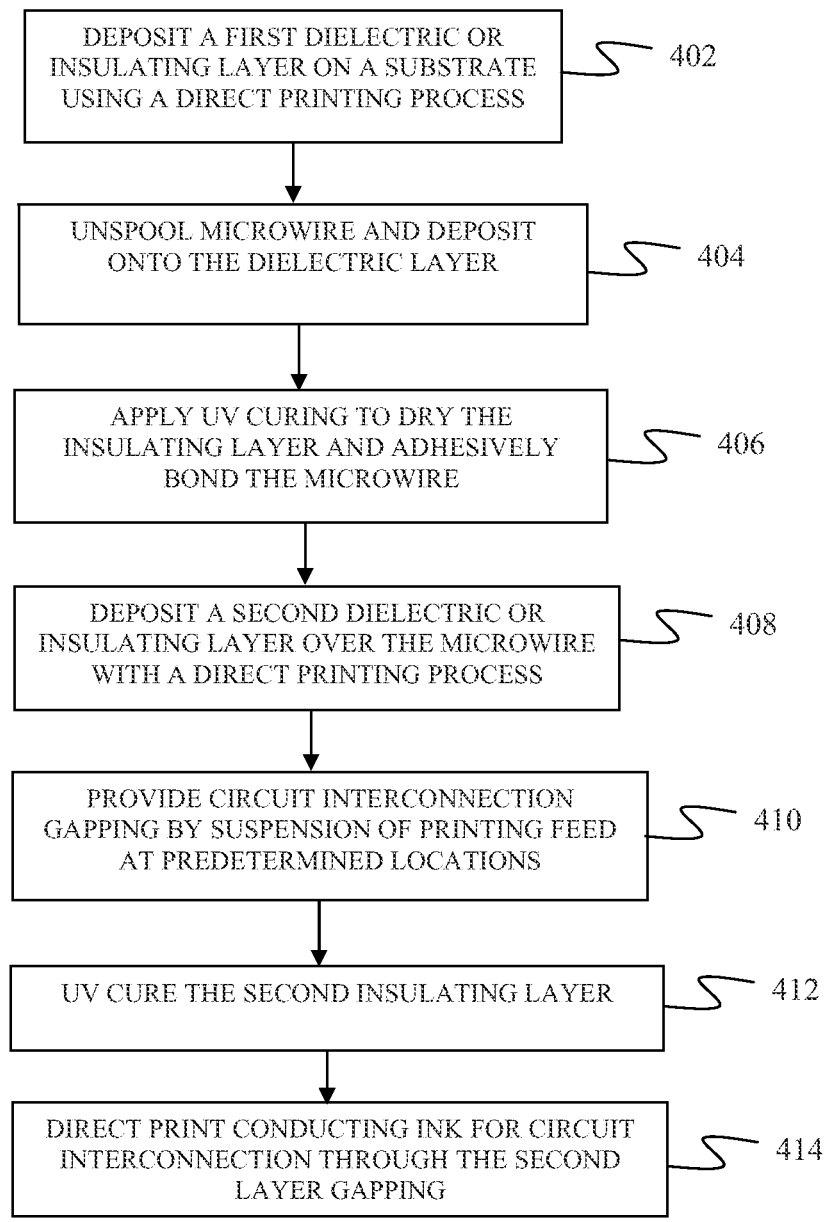

The embodiment described provides a process as shown in FIG. 4 for creating circuits by deposition of a first dielectric or insulating layer on a substrate using a direct printing process, step 402. A microwire is then unspooled and deposited onto the dielectric layer, step 404, which may adhesively bind the wire. In certain embodiments, UV curing is then applied to dry the insulating layer and adhesive, step 406. A second dielectric or insulating layer is then deposited over the microwire with a direct printing process, step 408, with circuit interconnection gapping by suspension of printing feed at predetermined locations, step 410. In certain embodiments, UV curing of the second insulating layer is then accomplished, step 412. For exemplary applications, direct printing of conducting ink for circuit interconnection through the second layer gapping is then employed, step 414.

Having now described various embodiments of the invention in detail as required by the patent statutes, those skilled in the art will recognize modifications and substitutions to the specific embodiments disclosed herein. Such modifications are within the scope and intent of the present invention as defined in the following claims.

What is claimed is:

1. A method for installing microwire comprising:
   supporting a first printing engine for the bottom layer of dielectric material;
   spacing a guide bale to track the first printing engine at a desired distance for placing the drawn microwire; and,
   spacing a second printing engine for the top layer of dielectric material to track the guide bale at a desire distance,
   printing a bottom layer of a dielectric material to insulate a drawn microwire from a substrate material;
   placing the drawn microwire on the layer of the dielectric material; and
   printing a top layer of the dielectric material to insulate the drawn microwire from its surroundings.

2. The method for installing microwire of claim 1 wherein the step of placing the drawn microwire comprises depositing the microwire trace onto the layer of dielectric material while still tacky from printing to provide an adhesive effect in constraining the microwire.

3. The method for installing microwire of claim 1 wherein the step of placing the drawn microwire further comprises drawing the microwire from a spool and feeding the drawn microwire through a set of feed rollers.

4. The method for installing microwire of claim 1 wherein the step of placing the drawn microwire further comprises employing a guide bale to orient and guide the microwire from the feed rollers for placement onto the dielectric.

5. The method for installing microwire of claim 1 wherein the step of placing the drawn microwire further comprises employing a tensioning guide to provide the desired linearity of the trace.

6. The method for installing microwire of claim 1 further comprising applying UV curing to dry the dielectric bottom layer.

7. The method for installing microwire of claim 6 further comprising applying UV curing to dry the dielectric top layer.

8. The method for installing microwire of claim 6 further comprising direct printing of conducting ink for circuit interconnection through the top layer gaps.

9. The method for installing microwire of claim 1 wherein printing a top layer includes providing gaps at predetermined locations for circuit interconnection.

10. The method for installing microwire of claim 1 wherein printing a bottom layer includes providing gaps at predetermined locations for circuit interconnection.

\* \* \* \* \*